(12) United States Patent
Ouchi et al.

(10) Patent No.: US 7,684,455 B2
(45) Date of Patent: Mar. 23, 2010

(54) OSCILLATOR AND IMAGING APPARATUS UTILIZING RESONANT TUNNELING DIODE STRUCTURE

(75) Inventors: Toshihiko Ouchi, Sagamihara (JP); Ryota Sekiguchi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 258 days.

(21) Appl. No.: 11/833,781

(22) Filed: Aug. 3, 2007

(65) Prior Publication Data
US 2008/0048792 A1 Feb. 28, 2008

(30) Foreign Application Priority Data
Aug. 25, 2006 (JP) ............... 2006-229083

(51) Int. Cl.
*H01S 5/34* (2006.01)
(52) U.S. Cl. ............. 372/45.011; 257/18; 331/107 T
(58) Field of Classification Search ......... 331/107 T, 331/107 SL; 257/104, 46, 615, 11, 14, 15, 257/18, 25, E29.042, E29.339, E29.34, E29.341, 257/E21.353, E21.367; 372/43.01, 45.01, 372/45.011
See application file for complete search history.

(56) References Cited

U.S. PATENT DOCUMENTS

| | | | |
|---|---|---|---|
| 5,586,131 A | 12/1996 | Ono et al. | |
| 5,659,560 A | 8/1997 | Ouchi et al. | |
| 5,699,373 A | 12/1997 | Uchida et al. | |
| 5,764,670 A | 6/1998 | Ouchi | |
| 6,854,901 B1 | 2/2005 | Ouchi | |
| 7,062,116 B2 | 6/2006 | Ouchi | |
| 7,248,995 B2 | 7/2007 | Itsuji et al. | |
| 2003/0206708 A1* | 11/2003 | Estes et al. | 385/130 |
| 2006/0039431 A1 | 2/2006 | Sekiguchi et al. | |
| 2006/0085160 A1 | 4/2006 | Ouchi | |
| 2006/0131557 A1* | 6/2006 | Shimizu et al. | 257/14 |
| 2006/0188398 A1 | 8/2006 | Yano et al. | |
| 2006/0197021 A1 | 9/2006 | Ouchi | |
| 2006/0214176 A1 | 9/2006 | Ouchi et al. | |
| 2006/0227340 A1 | 10/2006 | Shioda et al. | |
| 2006/0244629 A1 | 11/2006 | Miyazaki et al. | |
| 2007/0030115 A1 | 2/2007 | Itsuji et al. | |
| 2007/0195921 A1 | 8/2007 | Ouchi | |
| 2007/0215808 A1 | 9/2007 | Sekiguchi et al. | |
| 2007/0229094 A1 | 10/2007 | Kasai et al. | |
| 2007/0235718 A1 | 10/2007 | Kasai et al. | |
| 2007/0252604 A1 | 11/2007 | Ouchi et al. | |

FOREIGN PATENT DOCUMENTS

JP  2004-200286 A  7/2004

OTHER PUBLICATIONS

Moise, Theodore S., et al. "Impact of Lattice Mismatch on the Electrical Properties of AlAs/InGaAs/InAs Resonant Tunneling Diodes", Proc. SPIE, vol. 2694, Jan. 1996, pp. 126-136.*

(Continued)

*Primary Examiner*—Robert Pascal
*Assistant Examiner*—Ryan J Johnson
(74) *Attorney, Agent, or Firm*—Fitzpatrick, Cella, Harper & Scinto

(57) ABSTRACT

An oscillator including a substrate and a resonant tunneling diode including a gain medium provided on the substrate. The gain medium includes at least two quantum well layers and plural barrier layers for separating the quantum well layers from each other. The quantum well layers each have one of a compressive strain and a tensile strain. The plural barrier layers that sandwich the quantum well layers having the strain have a strain in a direction opposite to the direction of the strain of the quantum well layers.

14 Claims, 11 Drawing Sheets

OTHER PUBLICATIONS

Naoyuki Orihashi, et al., "Experimental and Theoretical Characteristics of Sub-Terahertz and Terahertz Oscillations of Resonant Tunneling Diodes Integrated with Slot Antennas", Japanese Journal of Applied Physics, vol. 44, No. 11, 2005, pp. 7809-7815.

Masahiro Asada, "Density-Matrix Modeling of Terahertz Photon-Assisted Tunneling and Optical Gain in Resonant Tunneling Structures", Japanese Journal of Applied Physics, vol. 40, 2001, pp. 5251-5256.

R. People, et al., "Calculation of critical layer thickness versus lattice mismatch for GexSi1-x/Si strained-layer heterostructures", Applied Physics Letters, vol. 47, No. 3, Aug. 1985, pp. 322-324.

K. T. Lai, et al., "Photovoltaic operation up to 270 K of a strain-compensated AlAs/In 0.84 GA 0.16 As/AlAs/InAlAs quantum well infrared photodetector", Applied Physics Letters, vol. 87, 2005, pp. 192113-1 to 192113-3.

U.S. Appl. No. 10/587,261, International Filing Date: Mar. 27, 2006, Applicant(s): Sekiguchi, et al.

U.S. Appl. No. 11/632,958, International Filing Date: Aug. 10, 2006, Applicant(s): Toshihiko Ouchi.

* cited by examiner

OSCILLATOR AND IMAGING APPARATUS UTILIZING RESONANT TUNNELING DIODE STRUCTURE

BACKGROUND OF THE INVENTION

1. Field of the Invention

The present invention relates to a current injection type electromagnetic wave oscillator. In particular, the present invention relates to a current injection type oscillator in a frequency region ranging from millimeter wave to terahertz wave (30 GHz to 30 THz). Still more particularly, the present invention relates to a current injection type oscillator having a resonant tunneling diode structure.

2. Description of the Related Art

In recent years, nondestructive sensing techniques using an electromagnetic wave having frequencies of at least a part of a frequency region ranging from millimeter-wave to terahertz-wave (30 GHz to 30 THz) (hereinafter, simply referred to as terahertz wave) have been developed. Examples of such techniques, which have been developed in application fields of the electromagnetic wave of this frequency band, include an imaging technique using a safe fluoroscopic apparatus in place of an X-ray fluoroscope, and a spectral technique for obtaining an absorption spectrum or complex dielectric constant of a material to examine physical properties such as a bonding state. In addition, a technique for analyzing biomolecules, a technique for evaluating a carrier concentration or mobility, and the like have also been developed.

Examples of terahertz wave generating units include a unit for emitting a femtosecond laser beam to a photoconductive device to generate a pulse and a parametric oscillation unit for emitting a nanosecond laser beam to a nonlinear crystal to generate a specific frequency. However, each of the units is based on photoexcitation, so there is a limit on a reduction in size or power consumption.

Therefore, for example, a structure using a quantum cascade laser and a structure using a resonant tunneling diode (resonant tunneling diode type) have been studied for the current injection type device that operates in the terahertz wave region. In particular, the latter resonant tunneling diode type is expected for a device that operates at around 1 THz at room temperature (see Japanese Journal of Applied Physics, Vol. 44, 2005, pp.7809-7815). The resonant tunneling diode type typically includes a quantum well with a lattice-matched system InGaAs/InAlAs which is formed on an InP substrate by epitaxial growth. In order to thin a barrier layer to improve current density, an AlAs structure has been studied. With respect to a voltage-current (I-V) characteristic and an oscillation characteristic of the AlAs structure, as illustrated in FIG. 12, a negative resistance is exhibited and an oscillation in the vicinity of a region corresponding to the negative resistance is observed.

However, in this case, the oscillation output is limited by a gain resulting from the negative resistance in an active layer and an injectable current density. Therefore, in order to obtain a high power output, it is necessary to improve the structure of the active layer and the structure of the resonator. That is, it is desirable to increase the peak current density and the gradient in the negative resistance region (negative differential conductance) shown in FIG. 12.

An example of the disclosed structure for improving the current density to increase the gradient in the negative resistance region is a structure for improving the current density using a strain system (compressive strain), in which an In composition of an InGaAs well layer is increased (see Japanese Patent Application Laid-open No. 2004-200286).

Incidentally, in order to reduce propagation loss of a transmission line of a resonator in an oscillator, it is desirable to thicken the active layer. Therefore, a method of providing a triple barrier structure to thicken the active layer without reductions in gain and current density is expected.

However, when the triple barrier structure is to be provided using the strain well structure described in Japanese Patent Application Laid-open No. 2004-200286 to improve the characteristics including an oscillation output of the oscillator, because there is a critical film thickness due to the use of the strain well structure, the thickness cannot be increased above a certain level. Therefore, it is not easy to reduce a resonator loss using the resonant tunneling diode structure and to improve the current density and the gain to thereby increase the oscillation output.

SUMMARY OF THE INVENTION

In view of the above-mentioned problem, according to the present invention, there is provided an oscillator including: a gain medium having a gain of an electromagnetic wave; a resonator for confining the electromagnetic wave to the gain medium; and a unit for injecting a carrier into the gain medium. The gain medium includes at least two quantum well layers and plural barrier layers for separating the quantum well layers from each other. The gain medium has a structure based on a resonant tunneling diode in which carrier transition between sub-bands of the at least two quantum well layers is caused through a photon assist tunnel to generate a gain. The quantum well layers each have a lattice constant different from a lattice constant of a substrate of crystal and are comprised of a layer which has a film thickness smaller than a critical film thickness and has a strain. And the plural barrier layers each have a strain in a direction opposite to the direction of the strain of the quantum well layers and include at least one layer having a lattice constant different from the lattice constant of the substrate. The electromagnetic wave typically includes at least a part of a frequency region ranging from 30 GHz to 30 THz.

Further, in view of the above-mentioned problem, a feature of a sensing apparatus according to the present invention resides in inspecting an interaction between an object to be inspected and an electromagnetic wave of a part of a frequency region ranging from 30 GHz to 30 THz using the oscillator as an oscillation source. A feature of a sensing apparatus according to the present invention is conducting two-dimensional inspection of an interaction between an object to be inspected and an electromagnetic wave of a part of a frequency region ranging from 30 GHz to 30 THz using the oscillator as an oscillation source, thereby obtaining image data. When the oscillator according to the present invention is used, a small-sized low-power-consumption system can be realized for the sensing apparatus or the imaging apparatus in a terahertz region as described in the "Description of the Related Art".

Further, according to the present invention, there is provided an oscillator including: a substrate; and a resonant tunneling diode including a gain medium provided on the substrate. The gain medium includes: at least two quantum well layers; and plural barrier layers for separating the quantum well layers from each other. The quantum well layers each have one of a compressive strain and a tensile strain. The plural barrier layers that sandwich the quantum well layers having the strain have a strain in a direction opposite to the direction of the strain of the quantum well layers.

According to the present invention, the gain medium includes the quantum well layer and the barrier layer which have suitably selected compositions and the strains in the directions opposite to each other, so a band gap and a film thickness of each of the well layer and the barrier layer can be relatively flexibly set. Therefore, an injection current density of an active layer can be increased to increase oscillation output power. The gain medium active layer can be made relatively thick, so propagation loss can be reduced, generation efficiency of the electromagnetic wave can be increased, and threshold current density can be reduced.

Further features of the present invention will become apparent from the following description of exemplary embodiments with reference to the attached drawings.

DESCRIPTION OF THE EMBODIMENTS

Figure 1A:
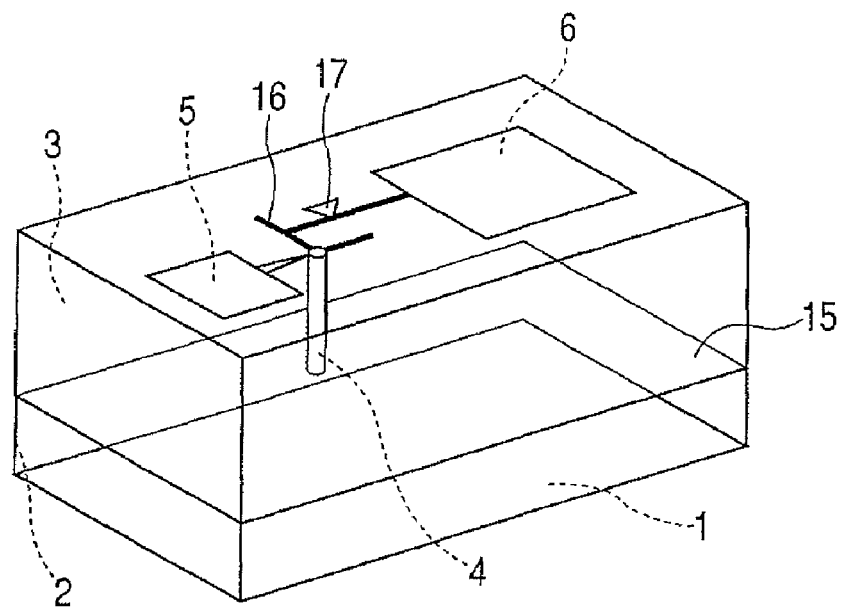
FIGS. 1A, 1B and 1C are a perspective view illustrating an oscillator according to an embodiment and examples of the present invention, a diagram illustrating an active layer structure thereof, and a detailed view of post 4 depicted in FIG. 1A, respectively.

Hereinafter, an oscillator according to an embodiment of the present invention will be described. The oscillator is provided to solve the following problem. That is, when a strained lattice is used to increase a gain, an active layer is limited in thickness. When a resonator is constructed, because the active layer is thin, electromagnetic wave is not sufficiently confined thereto. Therefore, the propagation loss becomes larger, so oscillation characteristics cannot be improved. In an oscillator according to the exemplary embodiment of the present invention, each of quantum wells of a triple barrier quantum well structure is formed at a thickness equal to or smaller than a critical film thickness. Barrier layers for separating the quantum wells from each other have a strain in a direction opposite to the direction of the strain stored in the quantum wells with a lattice constant of a substrate being a boundary. Thus, a strain amount of the entire quantum well structure is reduced to nearly zero so that the multilayer structure can be obtained. That is, when a crystal whose lattice constant is larger than the lattice constant of the substrate is used for the well layers, a compressive strain is applied to a region in which strain relaxation does not occur. However, in order to cancel the compressive strain, a crystal whose lattice constant is small is desirably used for the barrier layers to generate a tensile strain.

For example, in an InGaAs/InAlAs quantum well located on an InP substrate, when the In composition of the InGaAs layer used as the well layer is set to 53% or more, the band gap becomes smaller. Therefore, conduction carriers are easily collected, thereby improving the current density to increase the gain. However, the strain (compressive strain) simultaneously becomes larger, so the crystallinity is deteriorated by the strain depending on thickness. When the number of layers is equal to or larger than two, there is a limit on the well layer thickness, thereby reducing the degree of freedom of design. Thus, when one of an AlAs layer and an InAlAs layer whose In composition is 50% or less, more desirably 30% or less, is used as the barrier layer to provide a stain (tensile strain) in the opposite direction for compensation, a resonant tunneling diode structure of the triple barrier structure can be obtained.

In this case, the thickness can be typically made equal to or larger than two times a thickness of a double barrier structure. Therefore, even when a stripe-shaped transmission line is provided, a propagation loss can be reduced. Thus, a reduction in oscillation threshold and an increase in emission power can be realized.

A structure using a transmission line and an antenna which is well known in a high-frequency oscillator or a stripe-shaped structure which is well known in a laser oscillator can be suitably used as the resonator structure of the oscillator. Because the resonant tunneling diode type has a wide gain band, it is desirable to add a structure for limiting the band to a single frequency. For example, in the case of the former type, the band can be controlled by a shape of a patch antenna. In the case of the latter case, a distributed-reflector/distributed-feedback resonator structure in which periodic grooves are formed can be employed.

Figure 1B:
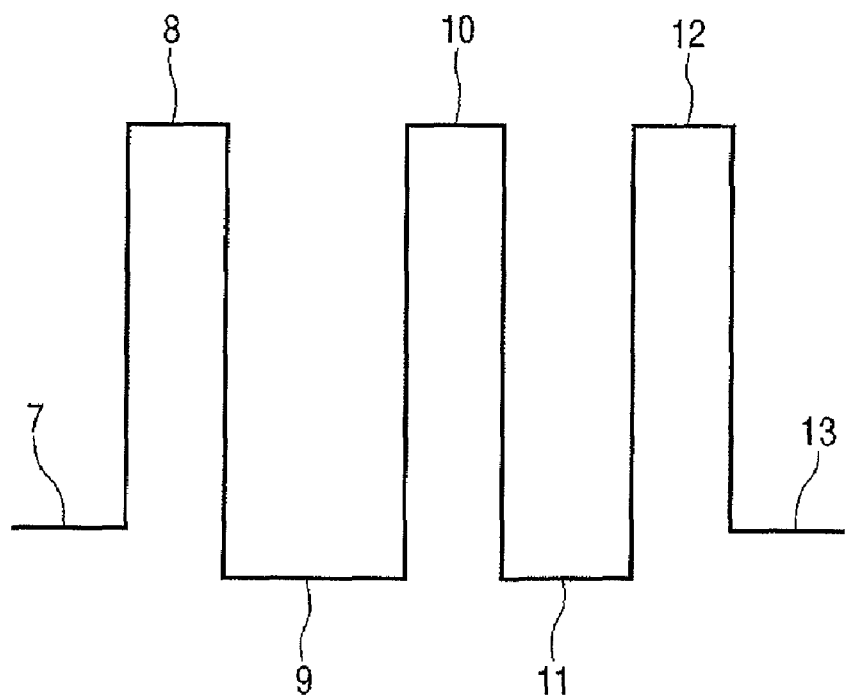

The embodiment will be described in more detail with reference to the attached drawings. FIGS. 1A and 1B are an explanatory view and an explanatory diagram illustrating a structure of a THz oscillator according to the embodiment of the present invention. FIG. 1A is a perspective view illustrating the structure and FIG. 1B is an energy band diagram of an active layer.

Figure 1C:
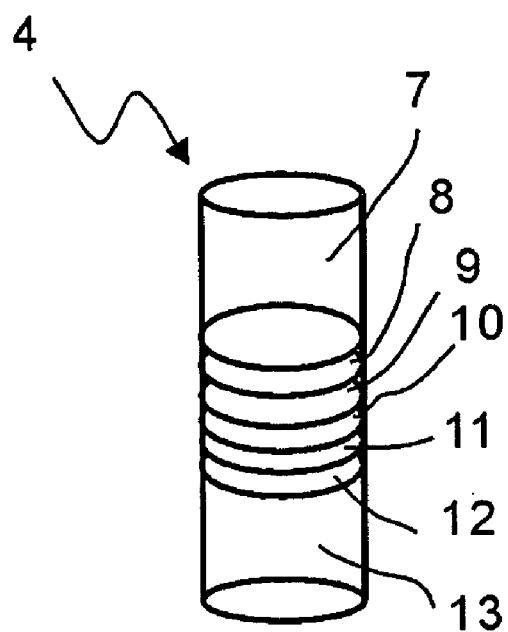

In this embodiment, as illustrated in FIGS. 1A, 1B and 1C a post 4 is formed with a diameter of approximately 4 μm on an InP substrate 2. The post 4 includes an n-InGaAs emitter layer 7, undoped AlAs/InGaAs triple barrier quantum well active layers composed of three barrier layers 8, 10, 12, and two quantum wells 9, 11 and an n-InGaAs collector layer 13. The post 4 is embedded in a BCB (trade name) 3. A transmission line 16 and an antenna 5 are formed on a surface of the BCB 3. A bias voltage of the device is applied between an electrode pad 6 and an electrode 1 formed on a rear side of the InP substrate 2.

The energy band diagram of the triple barrier quantum well active layers is illustrated in FIG. 1B. The In composition of the InGaAs well layers is adjusted such that the conduction bands 9 and 11 of the n-InGaAs to be the well layers becomes lower than the conduction bands of the n-InGaAs of the emitter layer 7 and the collector layer 13. According to such a structure, the maximum number of conduction carriers flowing from the left-side InGaAs which is the emitter layer 7 to the right-side InGaAs which is the collector layer 13 can be increased. Therefore, a gradient in a negative resistance region, i.e. a gain, can be increased.

Figure 2:
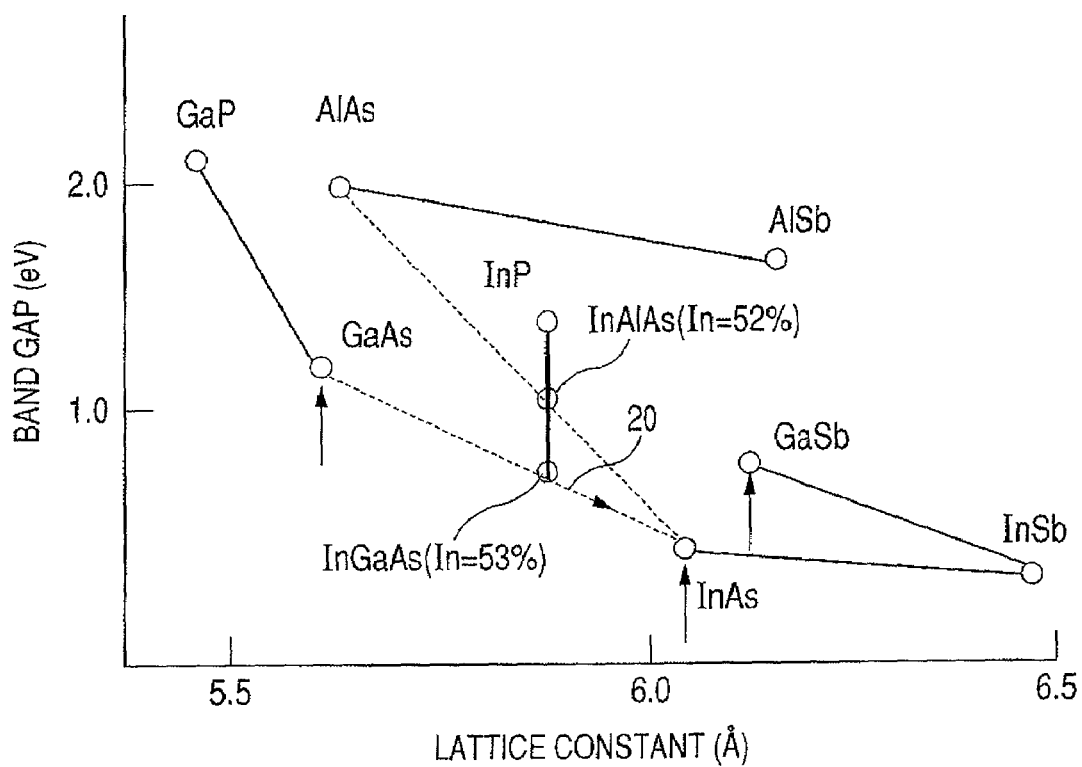
FIG. 2 is an explanatory graph illustrating a mixed crystal semiconductor.

A design example of the active layer will be described below. As illustrated in FIG. 2, with respect to InAsAs or InGaAs which constitutes the active layer, the lattice constant and the energy level are correlated with each other based on the composition ratio of In, Al, and Ga which are Group III elements. It has been known that In compositions which allow a lattice match with InP are 53% in the case of InGaAs and 52% in the case of InAlAs. When the In composition of the InGaAs serving as a well layer is increased along an arrow denoted by reference numeral 20 of FIG. 2, the band gap becomes smaller, so the conduction band can be shifted down. In FIG. 2, although the line joining respective compound semiconductors with each other is a straight line, this is a tentative line. The actual relationship between the lattice constant and the band gap in three-element mixed crystal is expressed by a joining line which is curved and convex downward.

Figure 3:
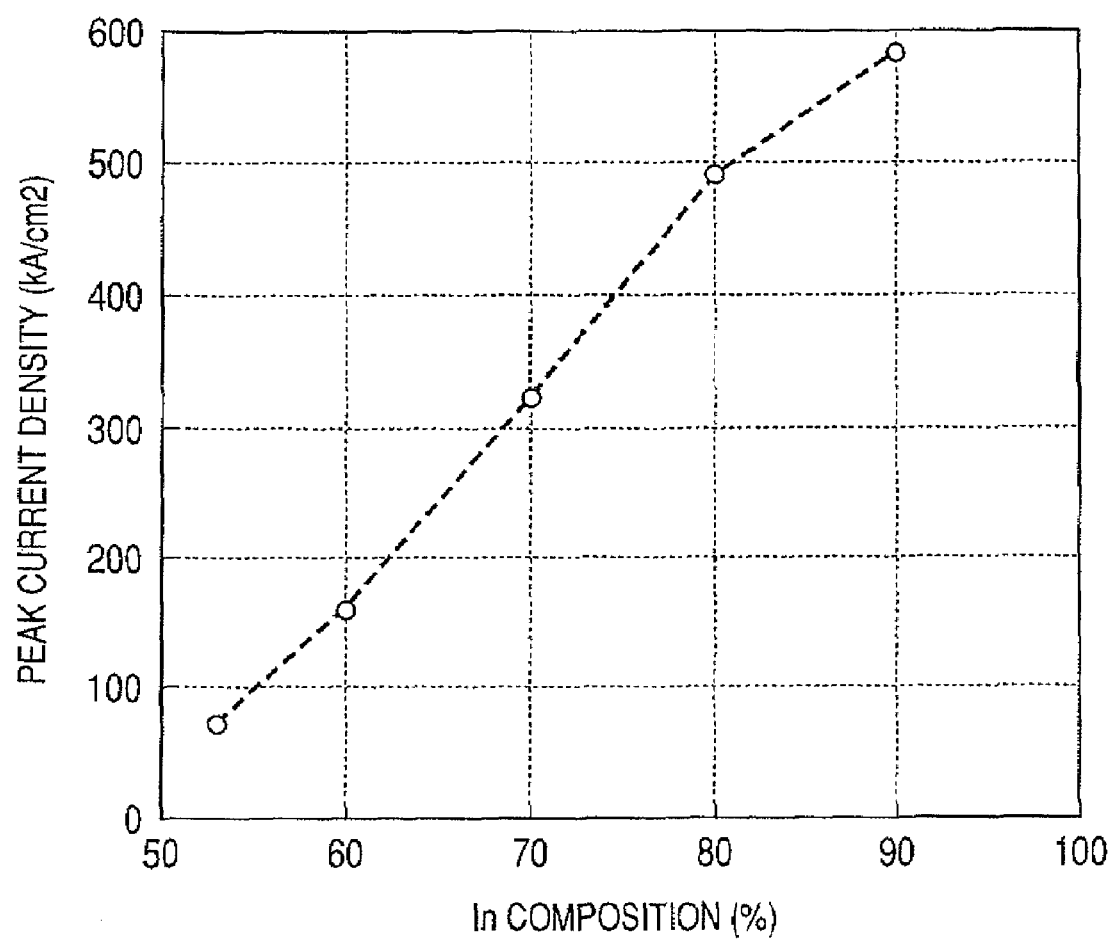
FIG. 3 illustrates a calculation example of a relationship between In composition and peak current density in a first example.

In this embodiment, the thicknesses of the respective layers of the triple barrier multiple quantum well structure from the emitter layer 7 side are set to 1.4 nm (AlAs), 7.8 nm (InGaAs), 1.4 nm (AlAs), 5.6 nm (InGaAs), and 1.4 nm (AlAs). While the In composition of the well layer is varied, numerical analysis of a current-voltage characteristic is performed to obtain a peak current density immediately before a negative resistance appears. FIG. 3 is a graph illustrating such peak current density. When the In composition of the well layer is increased from 53% as described above, the peak current density increases as illustrated in FIG. 3. When the composition is set to 60% or more, there is an effect of increasing the peak current density by two times or more.

Figure 4:
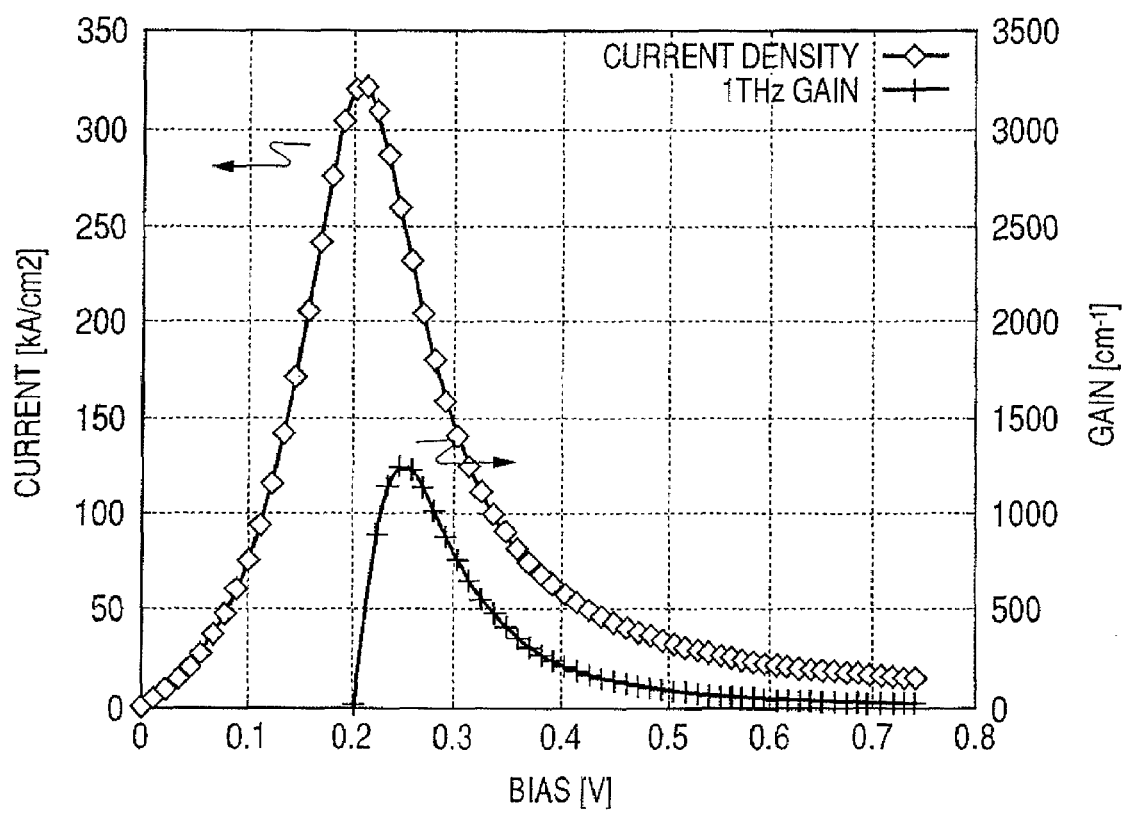
FIG. 4 illustrates calculation examples of a V-I characteristic and a gain characteristic in the first example.

For example, when the In composition of the well layers is set to 70%, it is apparent that the current density is approximately 320 kA/cm² and is thus increased by approximately five times the current density of a lattice-matched system (In: 53%). FIG. 4 illustrates a result obtained by simulation on a V-I characteristic and a gain characteristic of the device in this case. The peak of the current is exhibited at approximately 0.2 V. After the current reaches the maximum peak, a negative resistance is exhibited. In the negative resistance region, it is apparent that the maximum gain is approximately 1250 cm$^{-1}$ at 0.25 V. The calculation is performed based on the theoretical expression for the triple barrier resonant tunneling diode as described in Japanese Journal of Applied Physics, Vol. 40, p.5251, 2001.

That is, the emitter layer 7 side is taken as the left, carrier occupation probabilities of the well layers are expressed by $\rho_L$ (left) and $\rho_R$ (right), energy levels of the well layers are expressed by $\rho_{LR}$ (left) and $E_R$ (right), and carrier transition probabilities between the two well layers are expressed by $\rho_{LR}$ (left to right) and $\rho_{RL}$ (right to left). When tunneling transition energies of the three barrier layers are expressed by $T_L$, $T_C$, and $T_R$ in the stated order from the left, density matrix expressions are set up as follows.

$$\frac{\partial \rho_L}{\partial t} = \frac{T_C}{i\hbar}(\rho_{RL} - \rho_{LR}) + \frac{T_L}{\hbar}(\rho_{LO} - \rho_L)$$

$$\frac{\partial \rho_R}{\partial t} = \frac{T_C}{i\hbar}(\rho_{LR} - \rho_{RL}) + \frac{T_R}{\hbar}(\rho_{RO} - \rho_R)$$

$$\frac{\partial \rho_{RL}}{\partial t} = \frac{T_C}{i\hbar}(\rho_L - \rho_R) - \frac{\Gamma}{\hbar}\rho_{RL} -$$

$$\frac{1}{i\hbar}(E_R - E_L)\rho_{RL} - \frac{e}{i\hbar}\left\{\frac{V_{dc}}{a} + V_{QW}\cos(\omega t + \phi)\right\}\rho_{RL}$$

$$\rho_{LR} = \overline{\rho_{LR}}$$

Here, $\Gamma$ denotes a spread of resonant tunneling energy (level width), $V_{dc}$ denotes a bias voltage (where $1/\alpha$ denotes a voltage drop component between the well layers), and $V_{QW}$ denotes an alternating current voltage for exciting the active layer. In addition, $\rho_{LO}$ denotes occupation probability (two-dimensional carrier density) obtained by integration between the energy equal to $E_L$ on the emitter layer 7 and the Fermi energy. Further, $\rho_{RO}$ denotes occupation probability (two-dimensional carrier density) obtained by integration between the energy equal to $E_R$ on the collector layer 13 and the Fermi energy.

The V-I characteristic and the gain are obtained by numerical calculation based on the assumption that $T_C$=2.5 meV and $\Gamma$=15 meV (=$T_L$/2+$T_R$/2) in the above-mentioned expressions.

Figure 5:
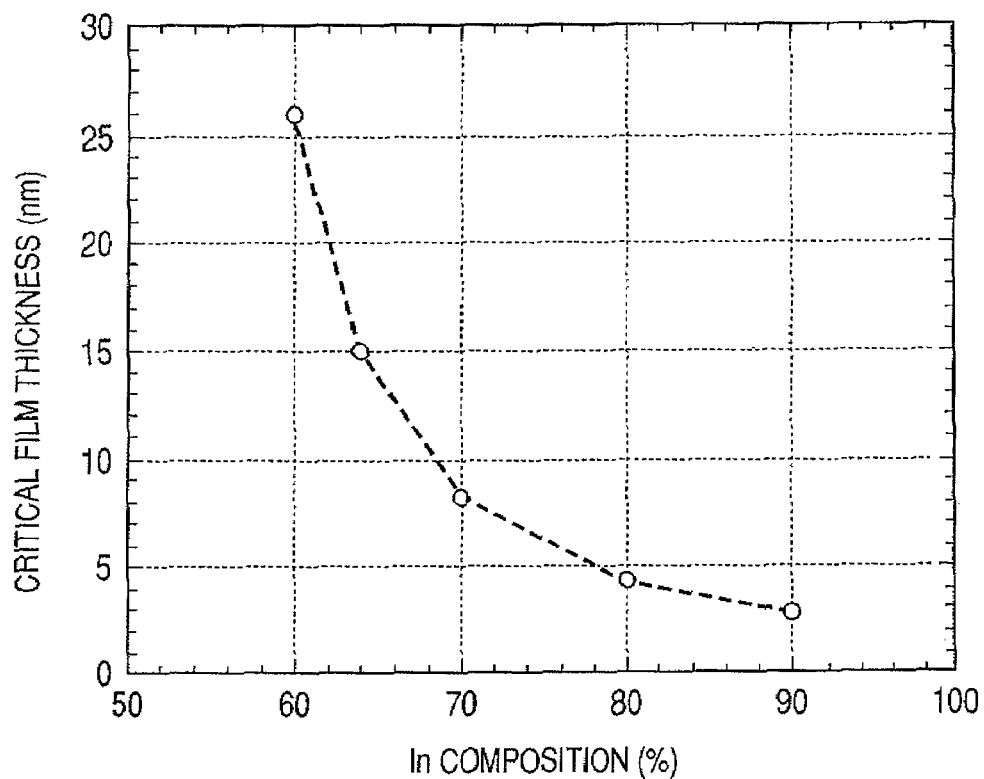
FIG. 5 illustrates a calculation example of a critical film thickness of an InGaAs layer located on an InP substrate.

Therefore, an increase in In composition of the well layer leads to an increase in gain. However, with respect to the lattice mismatch amount, one whose In composition is 70% has an applied compressive strain of 1.16%. FIG. 5 illustrates a result of approximate calculation on the critical film thickness dependency on the In composition in the case where the above-mentioned compressive strain is applied. This result is calculated based on a report (Applied Physics Letters, Vol. 47, p.322, 1985) with respect to the following expression in the case where the critical film thickness is expressed by hc and the lattice mismatch amount is expressed by f[=(lattice constant difference)/(substrate lattice constant)]. Note that b =0.4 nm (transfer distance) and v=⅓ (Poisson ratio).

$$hc \cong \left(\frac{b}{f}\right)\left[\frac{1}{4\pi(1+v)}\right]\left[\ln\left(\frac{hc}{b}\right)+1\right]$$

When the In composition is 70%, the critical film thickness is approximately 8 nm. Therefore, when epitaxial growth is performed in a state where there is no lattice relaxation, the above-mentioned two wells cannot be simply laminated. When AlAs is used for the barrier layer as in this embodiment, there is a tensile strain of −3.58%, so the critical film thickness tends to be eased. Note that the AlAs layer used as the barrier layer is thinned to be smaller than 1.8 nm which is the critical film thickness thereof. However, in order to maintain desirable crystal quality, it is necessary to design the AlAs layer with a sufficient margin relative to the critical film thickness. Therefore, an AlAs tensile strain barrier layer is used as the middle barrier layer 10, so the two wells can be laminated while compressive stains caused by the two InGaAs layers each having an In composition of 70% are suppressed. In contrast, when the conventional lattice-matched system InAlAs (In: 52%) barrier layer is used, because it is close to the critical film thicknesses, the crystal quality deteriorates and there is no degree of freedom of design, with the result that the In composition of the well layer cannot be set to a so large value. Thus, as illustrated in FIG. 3, the peak current density cannot be increased, so a significant increase in gain cannot be expected.

The design values described here are mere examples. When a tensile strain layer for compensating for the compressive stain in the well is used as the barrier layer, the same design can be employed. For example, referring to FIG. 2, when a substrate having a composition indicated by the arrow is used, the following combinations can be selected.

That is, provided are the following.

GaAs substrate: InGaAs well layer/AlAsP or GaAsP barrier layer.

InP substrate: InGaAs well layer/InAlAs or AlAsSb barrier layer. Here, the substrate is the InP substrate. For example, the well layer is an InGaAs or InAs layer whose In composition is 60% or more and 100% or less. The barrier layer includes at least two layers of InAlAs, or AlAs or AlAsSb, wherein the InAlAs has an In composition of 0% or more and 50% or less.

InAs substrate: InAsSb well layer/InAlAs or AlAsSb barrier layer. The substrate is the InAs substrate which includes at least the InAsSb well layer and the InAlAs or AlAsSb barrier layer.

GaSb substrate: InAsSb or InGaSb well layer/InAlAs or AlAsSb barrier layer. The substrate is the GaSb substrate which includes at least the InAsSb or InGaSb well layer and the InAlAs or AlAsSb barrier layer.

In the above-mentioned combinations, according to the design using the AlAsSb barrier layer, the barrier of the barrier layer can be raised to improve the degree of freedom of design, and carrier mobility can be increased to further increase the gain.

For nitride systems, for example, a GaN/InGaN/AlGaN multiple quantum well, the same design can be employed. When N is introduced, the carrier mobility can be increased to further increase the gain.

In the case where the InAlAs barrier layer located on the InP substrate is used, when the In composition is set to 50% or less, a tensile strain is expected to be generated. However, the stain is small around 50%, so it is necessary to increase the thickness of the barrier layer, thereby reducing the current density. Therefore, when the In composition is set to substantially 30% or less in view of the degree of freedom of the thickness of the barrier layer, the tensile strain increases, so the thickness of the barrier layer can be reduced. Thus, this is considered desirable for compensating for InGaAs strain.

When the structure in this embodiment is employed, the active layer of a gain medium includes the quantum well layer and the barrier layer which have the suitably selected compositions and the strains in the directions opposite to each other, so the band gap and the film thickness of the well layer and the barrier layer can be relatively flexibly set. Therefore, the injection current density or the gain of the active layer can be increased to increase laser oscillation output power. The active layer can be made relatively thick, so the propagation loss can be reduced, generation efficiency of the terahertz wave can be increased, and the oscillation threshold value can be reduced. Thus, power saving can be realized and a cooling unit for maintaining laser oscillation is simplified, or desirably, becomes unnecessary.

EXAMPLES

Hereinafter, device structures according to specific examples will be described. Note that sizes and materials are not limited to ones to be described.

First Example

In a first example of the present invention, the structure of FIGS. 1A and 1B as described in the above-described embodiment is employed. In this example, three AlAs barrier layers (1.4 nm in thickness) 8, 10, and 12 are used. The well layer is comprised of $In_{0.7}Ga_{0.3}As$ (7.8 nm in thickness) 9 and $In_{0.7}Ga_{0.3}As$ (5.6 nm in thickness) 11. Here, the design is made such that the strain amount of the entire multiple quantum well becomes 1% or less as described below.

That is, the strain amount $\epsilon$ of the entire multiple quantum well is expressed by the following expression (see Applied Physics Letters, Vol. 87, 192113, 2005).

$\epsilon$=[(well layer mismatch amount)×(total thickness of well layers)+(barrier layer mismatch amount)×(total thickness of barrier layers)]/thickness of entire multiple well Therefore, an AlAs barrier layers (mismatch is −3.56% and thickness is 1.4 nm ×3 layers) and $In_{0.7}Ga_{0.3}As$ well layers (mismatch is 1.16% and thickness is 7.8 nm+5.6 nm) are used in this example, so the calculated strain amount of the entire multiple well is 0.03%. Thus, the structure that provides high crystal quality, in which the strain amount is small and stably held and in which a lattice defect does not occur, can be obtained.

An MBE method is used for epitaxial growth of the semiconductor heterostructure. The triple barrier quantum well layers 8, 10, and 12 to be an active layer portion, an emitter layer 7, the collector layer 13, and contact layers for connecting electrodes therewith, form a post 4 of 4 μmΦ. This can be manufactured by EB exposure and induced coupled plasma (ICP) dry etching using a mixture gas of $SiCl_4$ and Ar. After the etching, a Cr/Au electrode 15 serving as a ground plane is formed on a surface of the InP substrate to provide a microstrip line 16. A dielectric layer 3 is formed by spin coating of the BCB (trade name: produced by The Dow Chemical Company) followed by heat baking. After that, the dielectric layer 3 is smoothed by RIE dry etching using a mixture gas of $CF_4$ and $O_2$ to expose the head of the post 4. The antenna 5, the electrode pad 6, and the transmission line 16 which are located on an uppermost surface are simultaneously formed by liftoff using Ti/Au.

In this example, the post 4 corresponding to the gain medium has the V-I characteristic of FIG. 4, so the antenna 5 and the transmission line 16 are designed such that the oscillation condition is satisfied at around 0.25 V. The electrode pad 6 for providing a DC bias is designed such that a lead line thereof is in contact with a node point on a resonator, that is, a point corresponding to a node in which an amplitude is zero at the time of resonance during oscillation. A low-pass filter 17 is further provided so as to eliminate the influence of surroundings of a power source.

Here, as a design example, in order to enable an oscillation at around 0.68 THz, the thickness of the BCB 3 is set to 3 μm and the width of the transmission line is set to 5 μm. The transmission line 16 serving as the resonator is formed at a length of 220 μm. The patch antenna 5 is formed such that the size thereof is 140 μm in a direction parallel to the transmission line 16 and 280 μm in a direction perpendicular thereto. A stub is provided as appropriate for phase adjustment, thereby performing the optimization. The design values are set such that the oscillation is made at 0.68 THz as a second harmonic. The design can also be made such that the fundamental wave becomes 1 THz. However, In the case of the structure using the patch antenna as described in this example, the antenna size may be reduced to thereby reduce extraction efficiency to the outside. Therefore, the above-mentioned structure is employed.

When a bias voltage of 0.25 V of 1 kHz and a duty of 10% is applied to the oscillator according to this example at a room temperature, laser oscillation is realized.

Second Example

Figure 6:
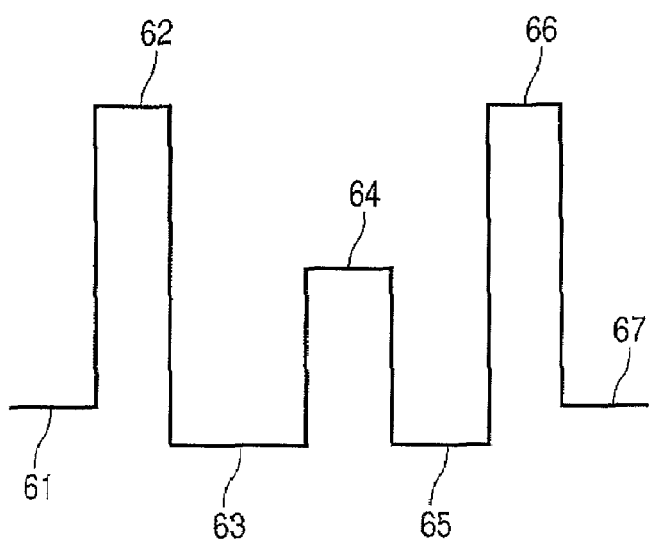
FIG. 6 illustrates an active layer structure in a second example.

In a second example of the present invention, a lattice-matched system $In_{0.52}Al_{0.48}As$ layer is used as the middle barrier layer. The band structure is illustrated in FIG. 6. FIG. 6 illustrates a lattice-matched system InGaAs emitter layer 61, AlAs barrier layers (1.4 nm in thickness) 62 and 66, a strained lattice $In_{0.64}Ga_{0.36}As$ well layer 63 having a thickness of 7.8 nm, and a strained lattice $In_{0.64}Ga_{0.36}As$ well layer 65 having a thickness of 5.6 nm. A middle barrier layer 64 is the lattice-matched system InAlAs layer having a thickness of 2.7 nm as described earlier.

Figure 7:
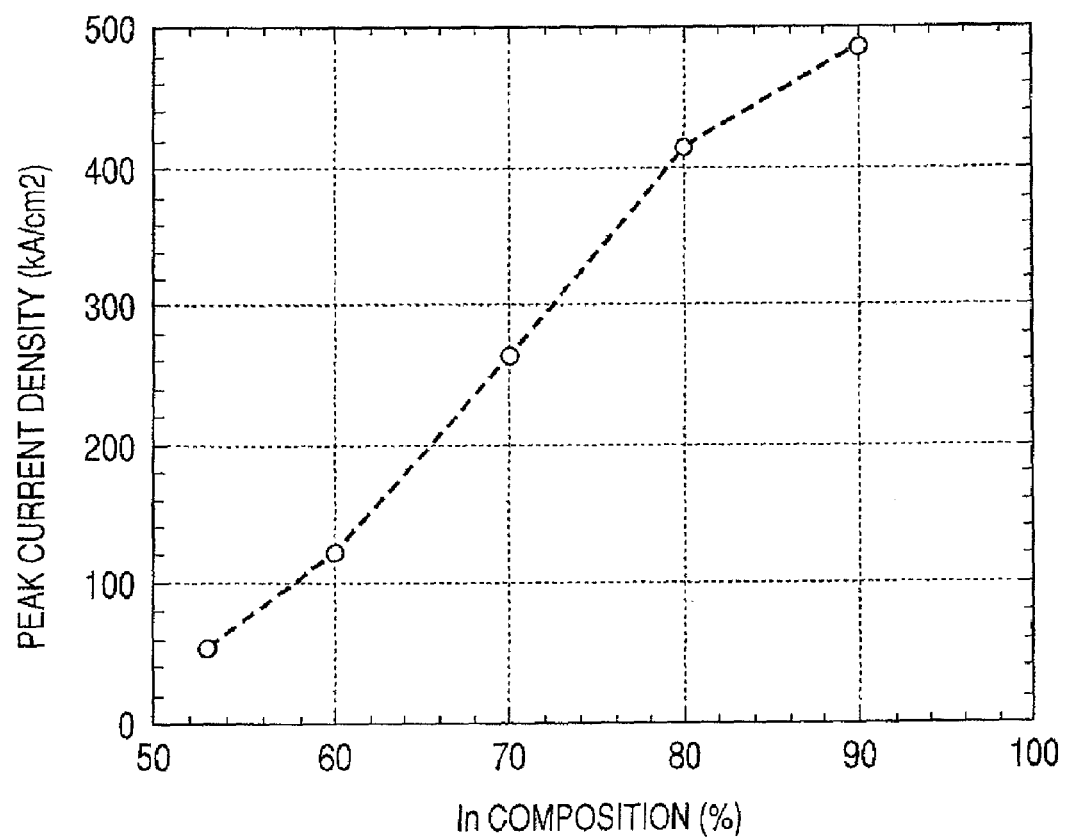
FIG. 7 illustrates a calculation example of a relationship between In composition and peak current density in the second example.
Figure 8:
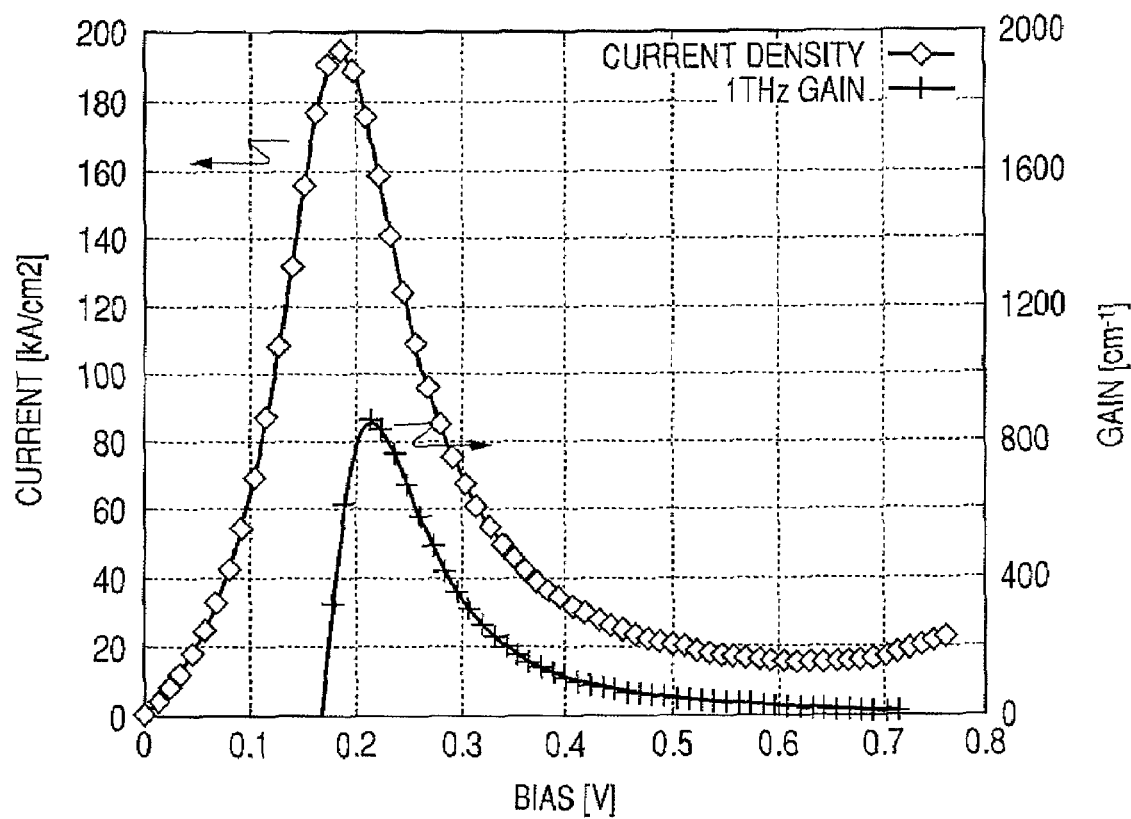
FIG. 8 illustrates calculation examples of a V-I characteristic and a gain characteristic in the second example.

When the lattice-matched system InAlAs layer is used as described above, the relationship between the In composition of the well layer and the peak current density thereof is calculated as illustrated in FIG. 7. As compared with FIG. 3, the peak current density is reduced at a given In composition. That is, the gain also tends to reduce. In order to compensate for the strain of the entire quantum well, it is desirable to reduce the In composition of the well layer to be smaller than 70%. In view of the above-described expression, when the strain amount of the entire quantum well is to be reduced to nearly zero, it is desirable to set the In composition to 64%. In this case, the strain amount of the entire quantum well becomes substantially zero. FIG. 8 illustrates a result obtained by calculation of characteristics of the device designed as described above. It is apparent that the peak current density is approximately 200 kA/cm$^2$ at 0.18 V and the obtained maximum gain is 860 cm$^{-1}$ at 0.22 V.

As compared with the first example, the gain becomes smaller. However, as compared with the case of the conventional structure in which the strained quantum well is not used, the current density is three times or more, so the characteristics are improved. When an InGaAs/AlAs interface becomes a steep interface by the segregation of In, it is difficult to control the composition by epitaxial growth, so there is the case where this example is selected in view of the ease of manufacturing and yield. The same laser oscillation structure as the first example can be used.

Third Example

Figure 9B:
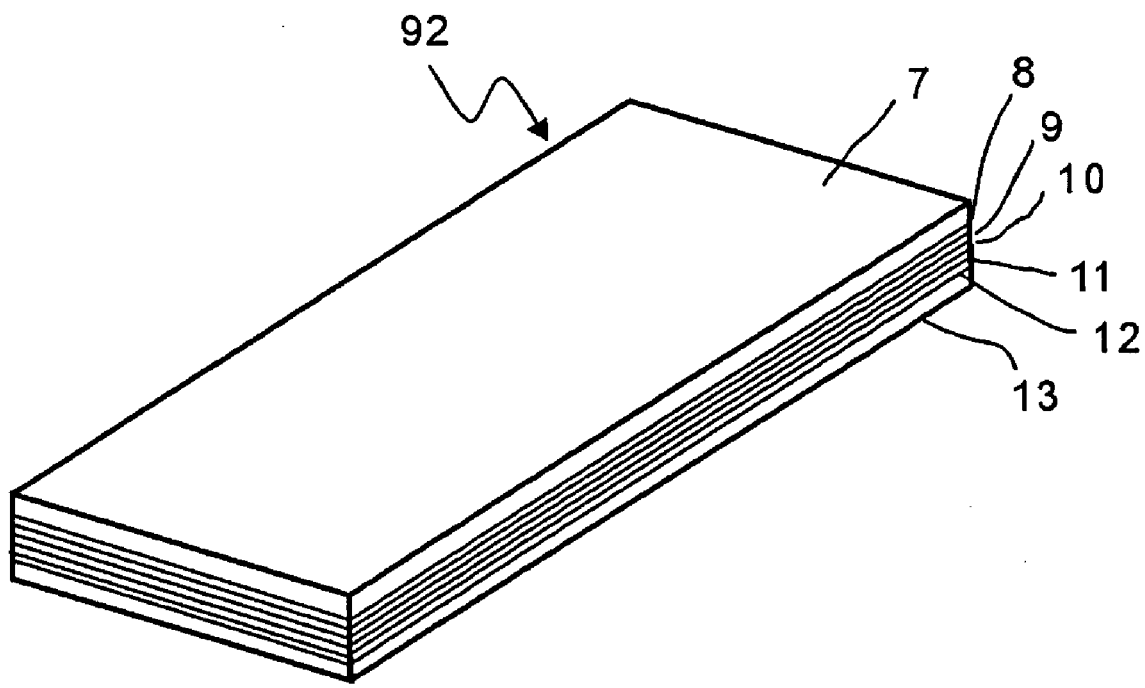
FIG. 9B is a detailed view of semiconductor layer 92 depicted in FIG. 9.
Figure 9:
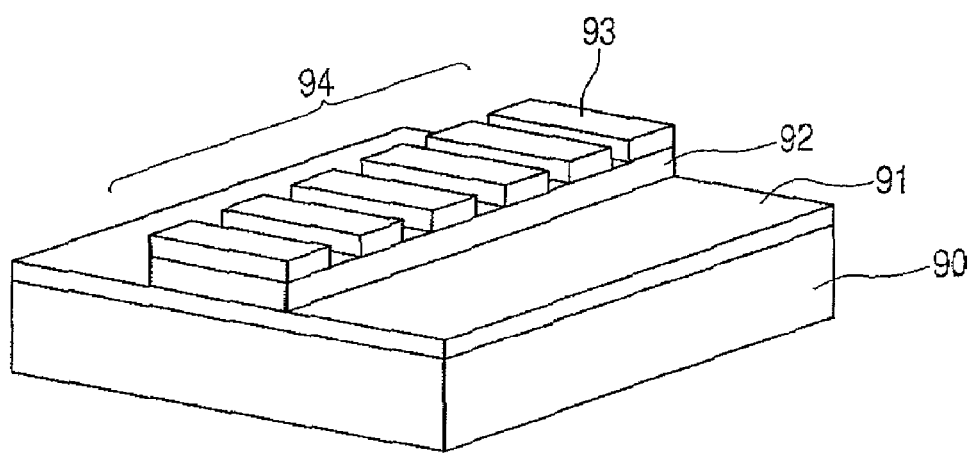
FIG. 9 is a perspective view illustrating an oscillator according to a third example.

In a third example of the present invention, not to the type using the antenna in the above-mentioned examples but to a stripe structure used in a general resonator as illustrated in FIG. 9 and FIG. 9B, the present invention is applied. In FIG. 9, a semiconductor layer 92 includes an active layer and is formed by sandwiching the triple barrier quantum well layer described in the first example by an n-InGaAs emitter layer and an n-InGaAs collector layer, each of which has a thickness of 53 nm (each including a non-doped portion (3 nm in thickness) which is in contact with a barrier layer) and an LnGaAs contact layer having a thickness of 100 nm. The Si-doped electron concentration of each of the emitter layer and the collector layer which are used for carrier injection is set to 1×10$^{18}$ cm$^{-3}$. The concentration of the contact layer is set to a high doped concentration of 1×10$^{19}$ cm$^{-3}$, thereby reducing the contact resistance with each electrode. As a result, the semiconductor layer 92 portion has a thickness of approximately 324 nm.

Each of electrodes 93 and 91 is made of Ti/Pd/Au (50 nm/100 nm/300 nm). The active layer 92 has a structure in which the InP substrate used for growth is removed by the transfer of a semiconductor epitaxial layer. When the InP substrate is removed, because the uppermost surfaces of the electrodes formed in advance on the surface of the contact layer are Au, the electrodes are bonded to Ti/Au electrodes separately formed on the surface of an Si substrate 90 used as a hold substrate through Au—Au compression bonding, and then wet etching is performed. In the Au—Au compression bonding, for example, while heating is performed at a range of 100° C. to 400° C., a pressure of several Mpa is applied. In some cases, ultrasound is further applied. The InP substrate is dissolved by hydrochloric acid but the AnGaAs serving as the contact layer is hardly dissolved thereby, so only the epitaxial layer can be selectively left.

A stripe structure 94 is formed by photolithography and etching using an etchant of sulfuric acid system (mixture solution of $H_2SO_4+H_2O_2+H_2O$) in such a manner that the width thereof becomes 10 μm after the removal of the InP substrate. In order to make single frequency oscillation, a projected and recessed shape whose pitch is 11 μm is formed like the electrode 93 to generate a distributed feedback (DFB) laser oscillating at 1 THz. The stripe transmission line having the stripe structure 94 is designed such that the upper and lower faces constitute a double surface plasmon waveguide made of Au to obtain a low-loss waveguide (propagation loss). Therefore, a waveguide loss calculated using a finite element method is estimated to be approximately 470 cm$^{-1}$ at 1 THz and an equivalent refractive index is estimated to be approximately 13.5. The wavelength corresponding to 1 THz is 300 μm, so the diffraction grating pitch is obtained as Λ=300 μm/2/13.5≈11 μm. The estimated end portion mirror loss is 2 cm$^{-1}$ to 10 cm$^{-1}$ on both end surfaces of an oscillator having a length of 1 mm, so the loss of the entire resonator becomes 500 cm$^{-1}$ or less. When the active layer in this example is used, sufficient oscillation can be made because of the gain of 1250 cm$^{-1}$.

As described above, in this example, the propagation constant of the stripe surface plasmon transmission line is periodically changed along the propagation direction of an electromagnetic wave so that the electromagnetic wave becomes a standing wave by the use of Bragg reflection. However, the oscillator can be simply formed of a stripe surface plasmon transmission line and reflecting surfaces of end portions of the transmission line.

Figure 10:
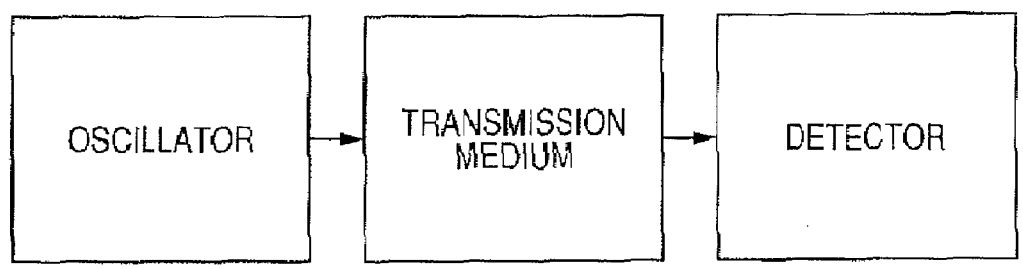
FIG. 10 is a block diagram illustrating a sensing apparatus according to the third example.

FIG. 10 is a block diagram illustrating an apparatus for sensing an object with a terahertz band using the above-mentioned laser oscillation device. The apparatus includes an oscillator, a transmission medium, and a detector which are arranged in the stated order. The oscillator, the transmission medium, and the detector may be integrated to obtain an integrated device. A transmission line such as space, a fiber, and a microstrip line is used as the transmission medium. An object to be inspected is placed in the transmission medium and an interaction with a terahertz electromagnetic wave is inspected using the detector. A Schottky barrier diode, a bolometer, or the like can be used as the detector.

In order to inspect the presence or absence of a fingerprint spectrum with respect to an object, the oscillator having multiple frequencies according to the present invention is prepared, whereby the object can be inspected based on a loss pattern with respect to each of the frequencies with reference to a data base obtained in advance.

Fourth Example

Figure 11:
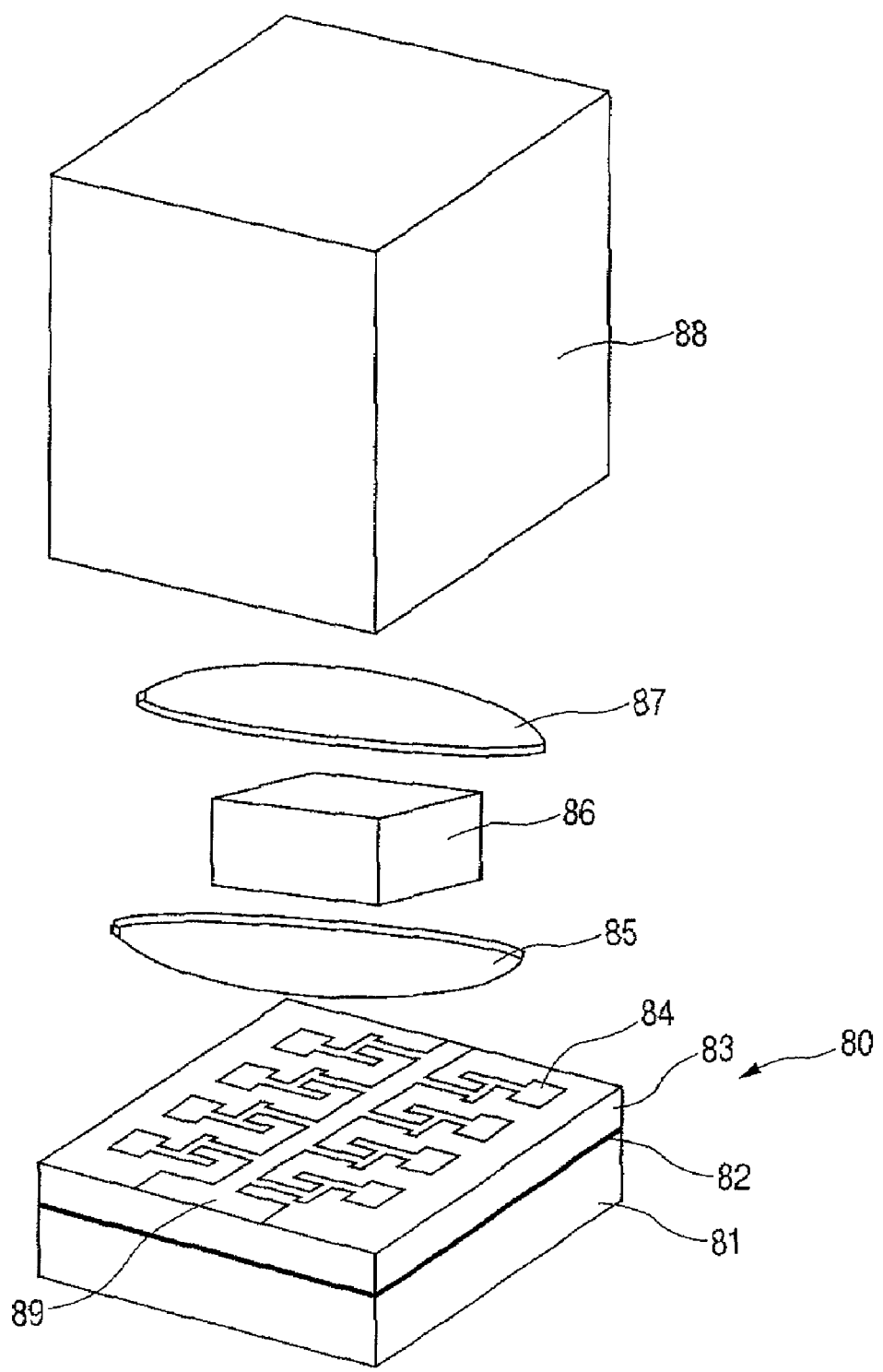
FIG. 11 illustrates an array oscillator and an imaging apparatus according to a fourth example.
Figure 12:
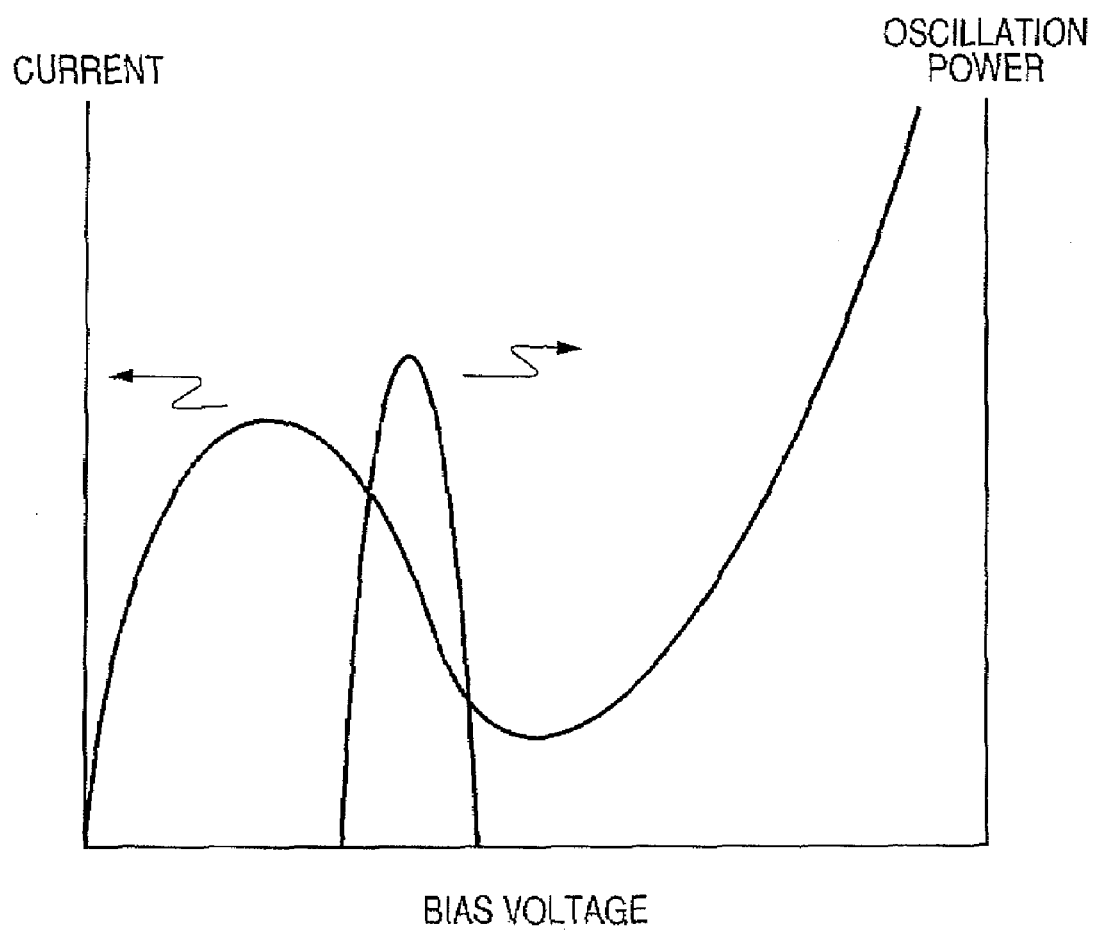
FIG. 12 illustrates characteristics of a resonant tunneling diode type oscillator.

In a fourth example of the present invention, as illustrated in FIG. 11, the oscillator according to the present invention is integrated on the same substrate to increase terahertz output, and transmission/reflection imaging of an object is performed.

Eight oscillators each having an antenna 84 as described in the first example are arranged in array on the same substrate 81 and oscillated at 680 GHz by the application of a bias voltage between a common electrode 89 located on a dielectric 83 and an electrode 82 located on the substrate. When the oscillators are arranged in array at a pitch shorter than approximately 500 μm which is the oscillation wavelength, the locking of the oscillation frequency occurs, so the output can be increased by approximately ten times as compared with the case of a single device.

By employing an oscillator 80 using a resonant tunneling diode as an oscillation source and by using lenses 85 and 87 and a two-dimensional array thermal detector 88, terahertz imaging can be performed on an object 86. For example, when there is a dangerous object in a box or a bag which is made of paper or plastic, the object can be checked by transmission imaging. Similarly, when the arrangement of the lenses and the detector is changed, a reflection imaging apparatus can be constructed. As described above, according to the imaging apparatus in this example, the interaction between the electromagnetic wave and the object is two-dimensionally inspected to obtain image data by using the oscillator according to the present invention as the oscillation source.

The lenses can be made of a resin material containing, as a main ingredient, polyethylene, polyolefin, or Teflon (trade name), each of which has high transmittance. As described above, when the oscillator according to the present invention is used, it is possible to realize a transmission/reflection imaging apparatus which is very compact and has low power consumption.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-229083, filed Aug. 25, 2006, which is hereby incorporated by reference herein in its entirety.

What is claimed is:

1. An oscillator for oscillating an electromagnetic wave, comprising:
   a substrate; and
   a resonant tunneling diode provided on the substrate,
   wherein the resonant tunneling diode comprises at least two quantum well layers and plural barrier layers for separating the quantum well layers from each other,
   wherein the two quantum well layers each has a lattice constant different from a lattice constant of the substrate and a film thickness smaller than a critical film thickness,
   wherein the plural barrier layers include a first barrier layer sandwiched by the two quantum well layers;
   wherein the first barrier layer has such a film thickness that carriers are able to be subjected to a photon assist tunnel between sub-bands of the two quantum well layers, and
   wherein a strain of the first barrier layer and the two quantum well layers is compensated by a strain of a barrier layer among the plural barrier layers that is not sandwiched by the two quantum well layers.

2. An oscillator according to claim 1, wherein the substrate is an InP substrate;
   wherein the quantum well layers are one of InGaAs and InAs each having an In composition of 60% or more and 100% or less; and
   wherein the barrier layers include at least two layers of InAlAs whose In composition is 0% or more and 50% or less and of one of AlAs and AlAsSb.

3. An oscillator according to claim 1, wherein
   the substrate is an InAs substrate; and
   wherein the gain medium comprises at least an InAsSb well layer and one of an InAlAs barrier layer and an AlAsSb barrier layer.

4. An oscillator according to claim 1, wherein the substrate is a GaSb substrate; and
   wherein the gain medium comprises at least one of an InAsSb well layer and an InGaSb well layer and one of an InAlAs barrier layer and an AlAsSb barrier layer.

5. An oscillator according to claim 1, wherein the substrate is a GaN substrate; and
   wherein the gain medium comprises at least an InGaN well layer and an AlGaN barrier layer.

6. An oscillator according to claim 1, wherein the electromagnetic wave includes at least a part of a frequency region ranging from 30 GHz to 30 THz.

7. An oscillator according to claim 1, further comprising a resonator for oscillating a terahertz wave generated from the resonant tunneling diode, wherein the resonator comprises at least a transmission line and an antenna.

8. An oscillator according to claim 1, further comprising a resonator for oscillating a terahertz wave generated from the resonant tunneling diode, wherein the resonator comprises a stripe surface plasmon transmission line and a reflecting surface at an end portion of the transmission line.

9. An oscillator according to claim 8, wherein a propagation constant of the stripe surface plasmon transmission line is periodically changed along a propagation direction of the electromagnetic wave, thereby causing the electromagnetic wave to become a standing wave by Bragg reflection.

10. A sensing apparatus, comprising the oscillator according to claim 1, which is used as an oscillation source, wherein an interaction between an electromagnetic wave having a part of a frequency region ranging from 30 GHz to 30 THz and an object to be inspected is inspected.

11. An imaging apparatus, comprising the oscillator according to claim 1, which is used as an oscillation source, wherein
   an interaction between an electromagnetic wave having a part of a frequency region ranging from 30 GHz to 30 THz and an object to be inspected is two-dimensionally inspected to obtain image data.

12. An oscillator according to claim 1, further comprising a carrier injecting unit for injecting carriers to the resonant tunneling diode.

13. An oscillator for oscillating an electromagnetic wave, comprising:
   a substrate; and
   a resonant tunneling diode provided on the substrate,
   wherein the resonant tunneling diode comprises:
   a first barrier layer that has a lattice constant different from a lattice constant of the substrate and has a film thickness smaller than a critical film thickness;
   a first quantum well layer that is in contact with the first barrier layer, has a lattice constant different from the lattice constant of the substrate, and has a film thickness smaller than the critical film thickness;
   a second barrier layer that is in contact with the first quantum well layer, has a film thickness smaller than the critical film thickness, and is so constructed that carriers in a sub-band of the first quantum well layer are able to be subjected to a photon assist tunnel;
   a second quantum well layer that is in contact with the second barrier layer, is arranged on a side opposite to the first quantum well layer via the second barrier layer, has a lattice constant different from the lattice constant of the substrate, and has a film thickness smaller than the critical film thickness; and
   a third barrier layer that is in contact with the second quantum well layer, has a lattice constant different from the lattice constant of the substrate, and has a film thickness smaller than the critical film thickness, wherein a strain of the second barrier layer and the first and second quantum well layers is compensated by a strain of the first and third barrier layers.

14. An oscillator according to claim 13, wherein the second barrier layer has a lattice constant that is matched with a lattice constant of the substrate.

* * * * *